United States Patent [19]

EerNisse et al.

[11] Patent Number: 4,837,475
[45] Date of Patent: Jun. 6, 1989

[54] CRYSTAL RESONATOR WITH LOW ACCELERATION SENSITIVITY AND METHOD OF MANUFACTURE THEREOF

[75] Inventors: Errol P. EerNisse, Salt Lake City; Roger W. Ward, Park City, both of Utah

[73] Assignee: Quartztronics, Inc., Salt Lake City, Utah

[21] Appl. No.: 103,670

[22] Filed: Oct. 2, 1987

[51] Int. Cl.$^4$ .................... H01L 41/04; H01L 41/08; H01L 41/22

[52] U.S. Cl. .................... 310/312; 310/348; 310/353; 29/25.35

[58] Field of Search ............... 310/312, 348, 353, 361, 310/369; 29/25.35; 367/13, 158, 162, 165, 167

[56] References Cited

U.S. PATENT DOCUMENTS

| | | | |
|---|---|---|---|
| 3,651,353 | 3/1972 | Hvgli et al. | 310/312 X |
| 4,410,822 | 10/1983 | Filler | 310/311 |
| 4,451,755 | 5/1984 | Vig et al. | 310/312 X |
| 4,453,141 | 6/1984 | Rosati | 331/158 |

OTHER PUBLICATIONS

Filler et al., "*Further Studies on the Acceleration Sensitivity of Quartz Resonators*", 37th Annual Frequency Control Symposium–1983.
Filler, "*The Acceleration Sensitivity of Quartz Crystal Oscillators: A Review*", 41st Annual Frequency Control Symposium–1987.
"Elastic Waves and Vibrations in Deformed Crystal Plates", Proceedings of the Twenty-Seventh Annual Frequency Control Symposium, U.S. Army Electronics Command, Fort Monmouth, N.J., 12–14, Jun. 1973.
"The Influence of Support-Configuration on the Acceleration Sensitivity of Quartz Resonator Plates", Proceedings of the Thirty-First Annual Frequency Control Symposium, U.S. Army Electronics Command, Fort Monmouth, N.J., Jun. 1–3, 1977.

Primary Examiner—Thomas H. Tarcza
Assistant Examiner—Gilberto Barrón, Jr.
Attorney, Agent, or Firm—Thorpe, North & Western

[57] ABSTRACT

Crystal resonator with low acceleration sensitivity includes a piezoelectric quartz crystal, support structure for holding the crystal and a signal source for causing the crystal to resonate with an active region of vibration. The resonator is modified, if need be, to control (generally reduce) the gamma vector which is a measure of the acceleration senstivity. This may be done by adding mass, removing mass, or both adding and removing mass, all in order to move or change the shape of the active region of vibration and thereby reduce the gamma vector.

22 Claims, 4 Drawing Sheets

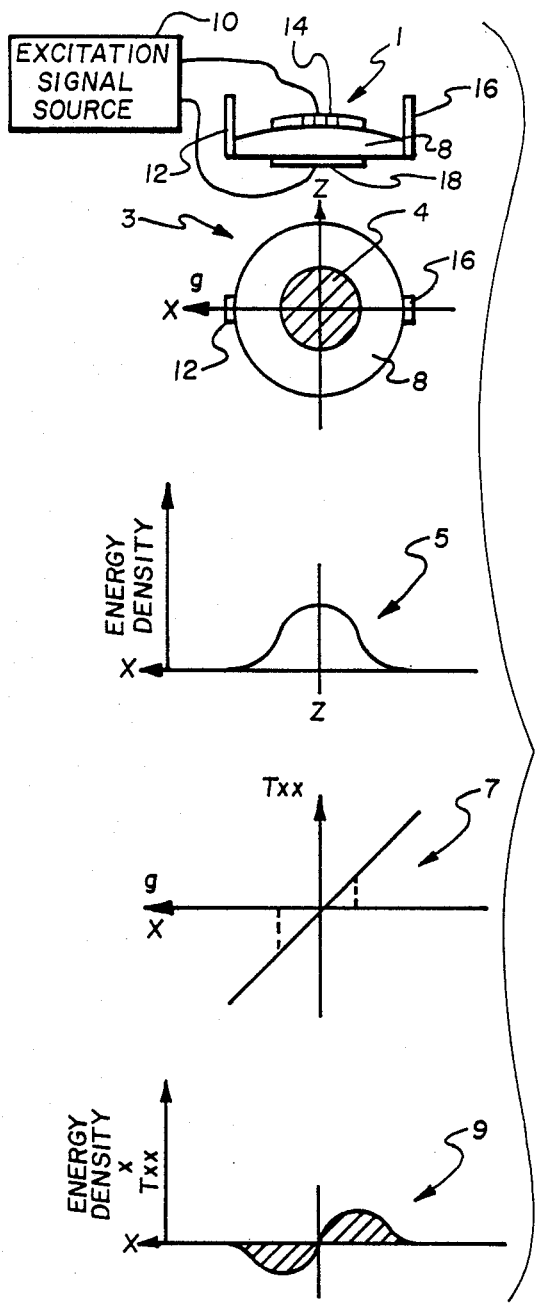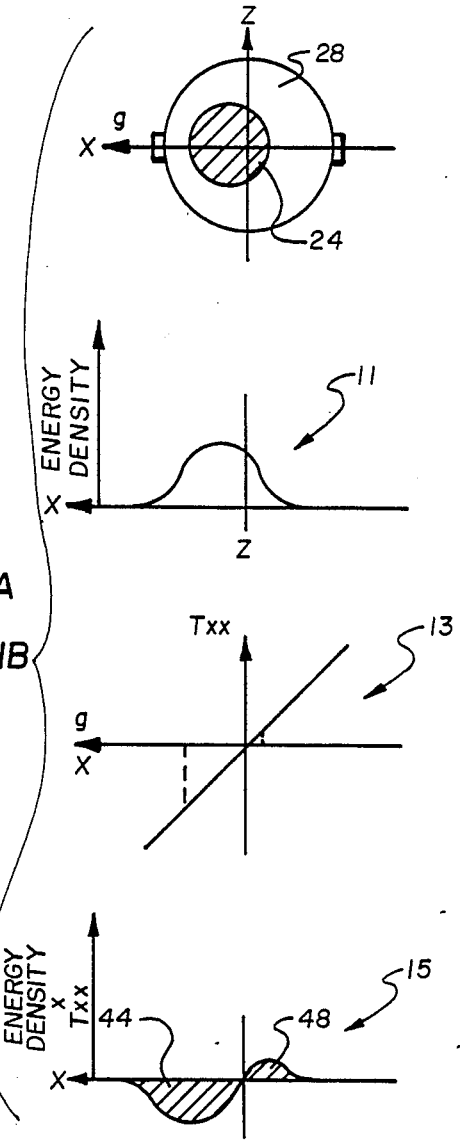
Fig. 1A
Fig. 1B

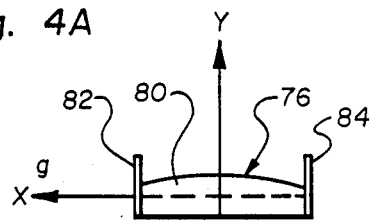
Fig. 4A
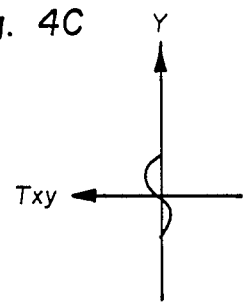
Fig. 4C
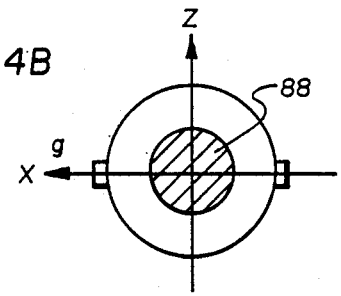
Fig. 4B
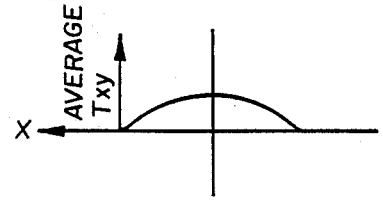
Fig. 4D
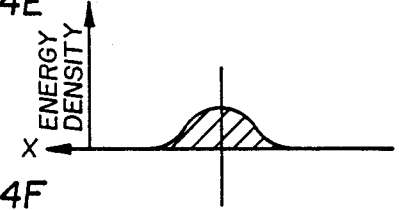
Fig. 4E
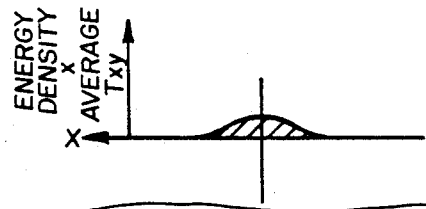
Fig. 4F
Fig. 5
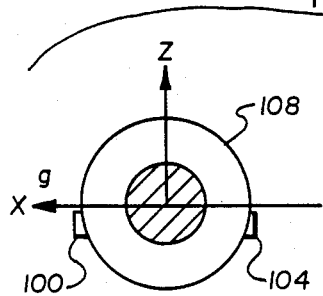
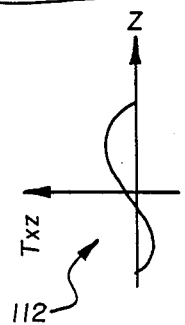
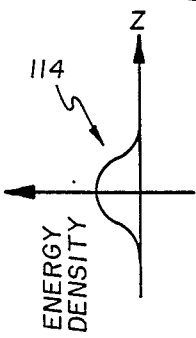
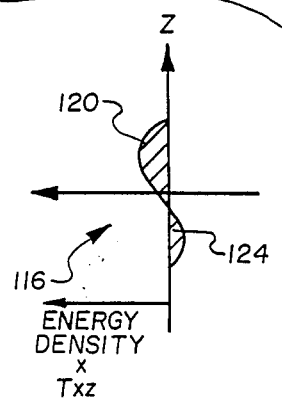

CRYSTAL RESONATOR WITH LOW ACCELERATION SENSITIVITY AND METHOD OF MANUFACTURE THEREOF

BACKGROUND OF THE INVENTION

This invention relates to crystal resonators manufactured to control their acceleration sensitivity.

Piezoelectric quartz crystal resonators have long been employed to develop highly accurate timing signals for such applications as communications, navigation and radar. In particular, resonant frequencies of thickness shear mode quartz resonators are commonly used as timing standards in crystal-controlled oscillators.

In spite of the relative stability and precision of the frequency output of such quartz resonator controlled oscillators, frequency shifts and thus timing errors can occur when the resonator is subjected to acceleration (or gravity) caused stresses. These stresses are produced in the resonator as a result of interaction between the resonator crystal and its mounting or holding structure. Investigations have generally been unsuccessful in identifying effects, or whether there is any effect, of various parameters (crystal geometry, angle of cut, temperature, etc.) on acceleration sensitivity (see Filler et al "Further Studies on the Acceleration Sensitivity of Quartz Resonators", Proc. 37th Annual Symposium on Frequency Control, 1983, pp. 265-271; and Filler, Raymond L., "The Acceleration Sensitivity of Quartz Crystal Oscillators: A Review", paper delivered at 41st Annual Frequency Control Symposium, May, 1987.

A resonator's sensitivity to acceleration has been defined by a so-called "gamma vector". The vector is composed of three frequency shift components which coincide with the x, y & z mechanical (or geometric) axes of the crystal resonator and which are measured for acceleration applied in directions corresponding to each of the axes. Once the gamma vector is known for a crystal, the frequency shift for any acceleration vector a can be obtained as the dot product of that vector a and the gamma vector.

It is desirable, of course, to reduce the magnitude of the gamma vector as much as possible to reduce acceleration-caused frequency error. But, as indicated earlier, there has been little success in doing this in a practical and consistent manner. Crystals prepared and mounted in seemingly an identical fashion can, nevertheless, have different gamma vectors (in both direction and magnitude) for no apparent reason.

One approach for reducing the acceleration sensitivity involves use of two resonators with nearly identical gamma vectors, positioned relative to one another such that their gamma vectors are opposed. See U.S. Pat. No. 4,410,822. In this configuration, the two resonators can be used in series in an oscillator circuit to provide reduced acceleration sensitivity. Another approach uses the signal from an accelerometer placed to measure the acceleration in the direction of the gamma vector to electronically pull the crystal oscillator frequency in a direction to oppose the gamma vector effect. See U.S. Pat. No. 4,453,141.

The first of these methods is impractical because of the aforementioned fact that two crystals, seemingly prepared and mounted identically, have different gamma vectors. Even if one measures the gamma vector for each of the two crystals, the directions of the two gamma vectors will be so random that the physical mounting of the two crystals to position the gamma vectors in opposed fashion will require expensive positioning structure. In addition, the magnitudes of the two gamma vectors may be quite different, which would make the compensation ineffective. The second of these methods requires both expensive positioning of the accelerometer to accommodate an arbitrary direction for the gamma vector, and circuit adjustments to accommodate an arbitrary magnitude of the gamma vector.

A third approach for reducing acceleration sensitivity involves placing the crystal and oscillator circuit in a spring/mass vibration isolation structure to reduce the acceleration magnitude. This approach is limited in that only a certain degree of vibration isolation can be accomplished. In addition, the apparatus used is quite bulky.

SUMMARY OF THE INVENTION

It is an object of the invention to provide a crystal resonator manufactured to control its acceleration sensitivity.

It is also an object of the invention to provide a procedure for modifying quartz resonators to reduce their acceleration sensitivity.

The above and other objects of the invention are realized in a specific illustrative embodiment of a resonator having a generally disk-shaped crystal element held in place by two or more supports which contact the crystal element at or near its perimeter. After the crystal element is initially prepared and mounted, the gamma vector for the crystal element is determined using conventional methods. Additional bulk, such as gold or other metal, alloy, or compound is then applied in a thin sheet to the crystal surface to modify (generally reduce) the gamma vector. It has been found that by adding bulk to selected locations on the surface of the crystal element, the shape and/or location of the active region of vibration of the crystal can be changed and thus the acceleration sensitivity (represented by the gamma vector) of the element can be effectively modified and ultimately reduced. Removing crystal material from the crystal may also be used to modify the gamma vector.

BRIEF DESCRIPTION OF THE DRAWINGS

The above and other objects, features and advantages of the invention will become apparent from a consideration of the following detailed description presented in connection with the accompanying drawings in which:

FIGS. 1A, 1B and 1C show respectively pictorial representations of an ideal, symmetrical active region of vibration of an oscillatory crystal, a non-symmetrical active region of vibration with respect to the z axis, and a distorted non-symmetrical region of vibration, together with graphs illustrating effects on the crystal;

FIGS. 4A through 4D show a plano-convex crystal subjected to acceleration and the resulting stress $T_{xY}$ effects in the crystal; and FIG. 5 shows a crystal whose mounting pins are offset along the z axis with respect to the x axis, and the resulting stress $T_{xz}$ effects in the crystal caused by acceleration forces.

DETAILED DESCRIPTION

Figure 1C:
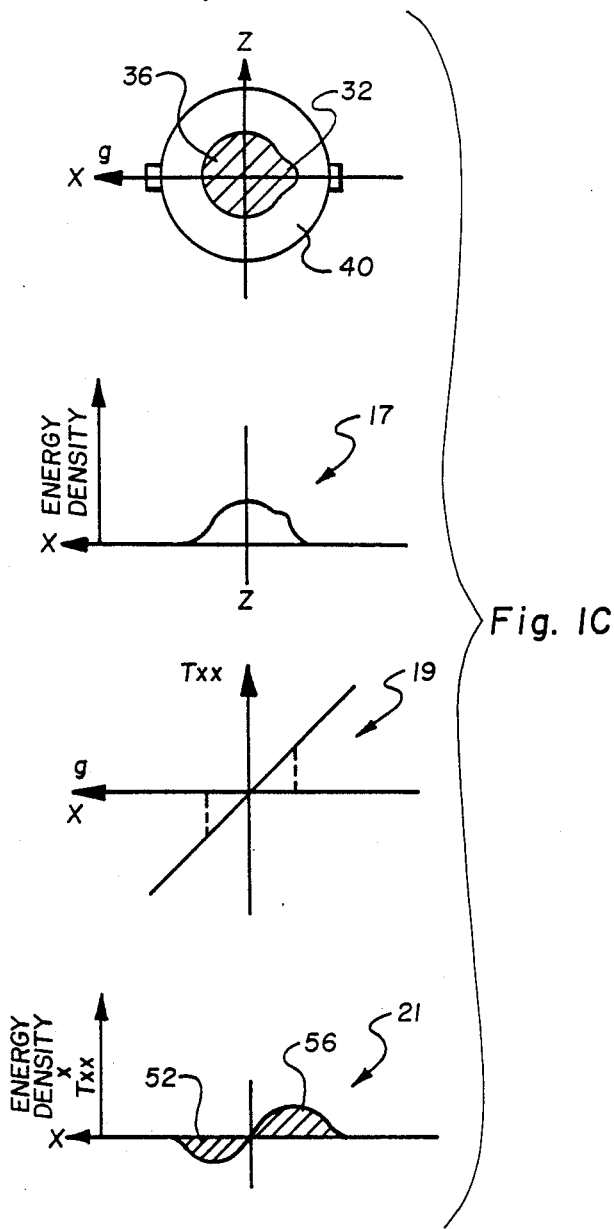

A quartz crystal resonating in the thickness shear mode contains an active region of vibration generally centered in the thickest part of the crystal element. Ideally, this active region would be symmetrical about the axes of the crystal element, in which case the gamma vector would be the same from device to device and in many cases minimized, but in practice perfect symmetry is very difficult to achieve. Among the causes for the non-symmetry are variations in crystal material properties, contouring imperfections, uneven metal electrode thickness, misshaped electrode patterns, etc.

FIG. 1A gives a pictorial representation of an ideal, symmetrical active region of vibration 4 of a disk-shaped crystal 8 supported on opposite sides by mounting pins 12 and 16. (The crystal 8 is shown in side view at 1 and top, plan view at 3.) The crystal 8 is caused to vibrate in a conventional way by an excitation signal source 10 coupled by way of electrodes 14 and 18 to the crystal in a well known manner. The active region 4 is symmetrical about both the x and z axes, and the energy of vibration of this active region is illustrated by graph 5. If the mounting pins of the crystal are accelerated to the right or the crystal is subjected to gravity (g) pulling in the x direction to the left, stress forces are developed in the crystal-compression in the left half (because the crystal is being pushed against the support 12) and tension in the right half (because the crystal is being pulled away from the support 16). The stress components, negative for compression and positive for tension, are shown in graph 7. The shift in resonant frequency is related to the product of stress $T_{xx}$ and energy density averaged over the crystal volume. As can be seen in graph 9 of FIG. 1A, the positive and negative components of this product are equal but opposite in sign and so cancel leaving a net product of substantially zero.

Previous theoretical treatments of acceleration sensitivity assumed a perfectly centered vibration region, so such treatments neglected the contributions to acceleration sensitivity of $T_{xx}$, and any other stresses that have odd symmetry. It has been discovered, however, that these stresses can cause sizeable contributions to frequency shift if the vibration region is only slightly off-center, or even just distorted.

FIG. 1B is a pictorial representation of an active region of vibration 24 of crystal 28, where the region is non-symmetrical with respect to the z axis. This lack of symmetry could be caused by contouring imperfections, variations in crystal material properties, etc., as previously noted. Actually, the active region 24 is shown as being symmetrical about its center line, but not with respect to the z axis. Other types of distortions of the active region of vibration can also occur as a result of manufacturing imprecision; an example is shown in FIG. 1C where a lobe 32 is formed on one side of the active region 36 of a crystal 40, giving rise to a non-symmetrical energy curve 17 as shown under the crystal. Achieving symmetry for the active region of vibration is desired to control the acceleration sensitivity-gamma vector.

Referring to FIG. 1B again, the energy density curve is non-symmetrical about the z axis as shown in graph 11. The stress forces $T_{xx}$ produced in the crystal 28, when the crystal 28 is subjected to a gravitational force g in the positive x direction (or is accelerated to the right), are shown in graph 13 of FIG. 1B. As shown in graph 15 of FIG. 1B, the product of energy density and stress averaged over the crystal volume is greater for compression (shown at 44) than for tension (shown at 48).

If a net compression stress is applied along the x crystallographic direction of an AT-cut quartz crystal resonator, the frequency of vibration of the crystal shifts to become greater (with net tension stress, the frequency would decrease). Thus, if the geometric x axis of the FIG. 1B graphs corresponds to the x crystallographic axis of the crystal, then with the asymmetrical region of vibration shown in FIG. 1B and the g force in the positive x direction, the resultant frequency error would be an increase in frequency. As a consequence, the contribution of stress $T_{xx}$ to the x component of the gamma vector would be positive if defined for gravity g acting from the positive x side. If the crystal were an SC-cut quartz crystal, or if it were made of a different material, such as Berlinite or $LiNbO_2$, there would still be a frequency shift induced by this off-center active region of vibration, the magnitude and sign of the frequency shift depending on the crystallographic orientation of the crystal with respect to the mounting pins.

Referring again to FIG. 1C, the energy density graph 17 shows a distortion on the negative x side which, for gravity (g) pulling to the left or acceleration to the right, gives rise to a net tension (as opposed to compression) stress as shown in graph 21 of FIG. 1C (area 56 is slightly larger than area 52). With a net tension stress where the x geometric axis is aligned with the x crystallographic direction for an AT-cut quartz crystal resonator 40, the frequency shift due to $T_{xx}$ would be a decrease in the frequency. In other words, the contribution of $T_{xx}$ to the x component of the gamma vector would be negative when defined for gravity (g) acting from the positive x side.

Figure 2A:
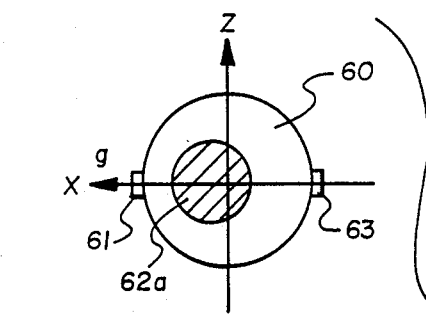
FIGS. 2A and 2B show respectively pictorial representations of a non-symmetrical active region of vibration with respect to the z-axis, and a "corrected" active region of vibration resulting from adding mass to a selected portion of the resonator surface, together with graphs illustrating effects on the crystal.
Figure 2A:
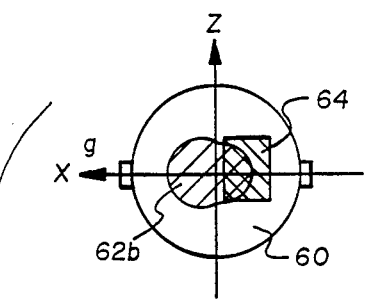
Figure 2B:
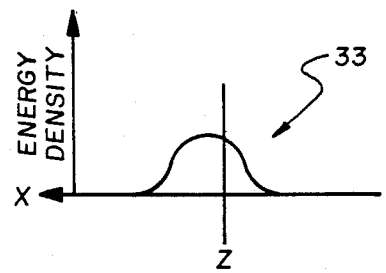
Figure 2B:
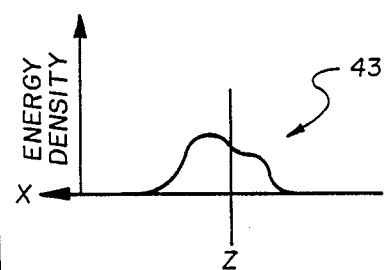
Figure 2B:
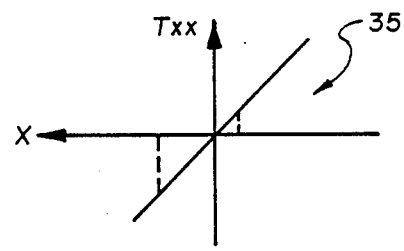
Figure 2B:
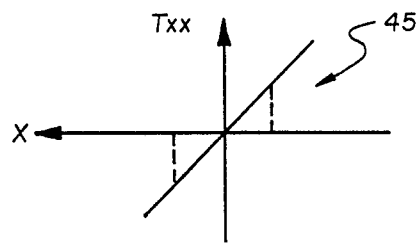

FIGS. 2A and 2B show, respectively, an active region of vibration 62a which is non-symmetrical with respect to the z axis of a crystal 60 (for reasons discussed earlier), and effects of a "correction" distortion introduced to mitigate the non-symmetry. The distortion is introduced by adding mass, such as a gold film patch 64 (added, for example, by well known evaporation techniques) to a selected portion of the surface of the crystal 60 (FIG. 2B). The introduced distortion results because the thickness shear mode active region of vibration tends to center in the region of the crystal having the thickest dimension (region of lowest resonant frequency). The introduced distortion caused by the gold patch causes a shift of the active region of vibration 62b toward the center of the crystal 60 (FIG. 2B), and thus a shift of the energy density curve (graph 43) to be more equally distributed about the z axis than is the energy density (curve 33 of FIG. 2A) for the "uncorrected" crystal. Accordingly, the product of energy density and stress $T_{xx}$ caused by gravity (g) acting from the left, etc.) averaged over the crystal volume (shown in graph 47 of FIG. 2B) is about the same for compression (shown at 68) as for tension (shown at 72) so that there is no net compression or tension. As a result, the original positive contribution of $T_{xx}$ to the x component of the gamma vector for the crystal of FIG. 2A (AT-cut with pins 61 and 63 on the x crystallographic axis) is reduced for the modified crystal of FIG. 2B. When a component of the gamma vector is reduced, the gamma vector is reduced in magnitude and/or the direction of the gamma vector changes.

As an alternative to adding mass on the right side of the crystal 60 of FIG. 2B, mass may be removed from the left side. This removal could involve either removing a portion of the crystal surface or removing some of the electrode(s), both from the left side. Additionally, the mass may remain essentially the same, but be redistributed to effect the desired correction. Thus, correction may be achieved by "modifying" the resonator mass in one or a combination of three ways-adding mass, subtracting mass or redistributing mass.

Figure 3:
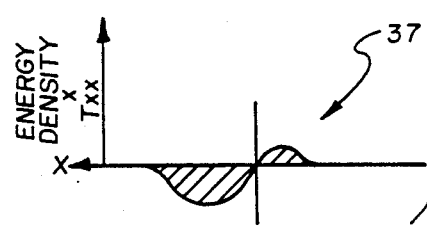
FIG. 3 shows pictorial representations of the six types of stress to which a crystal might be subjected and which would affect the gamma vector.
Figure 3:
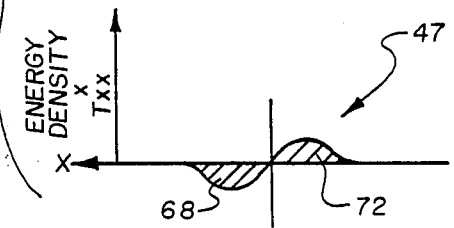
Figure 3:
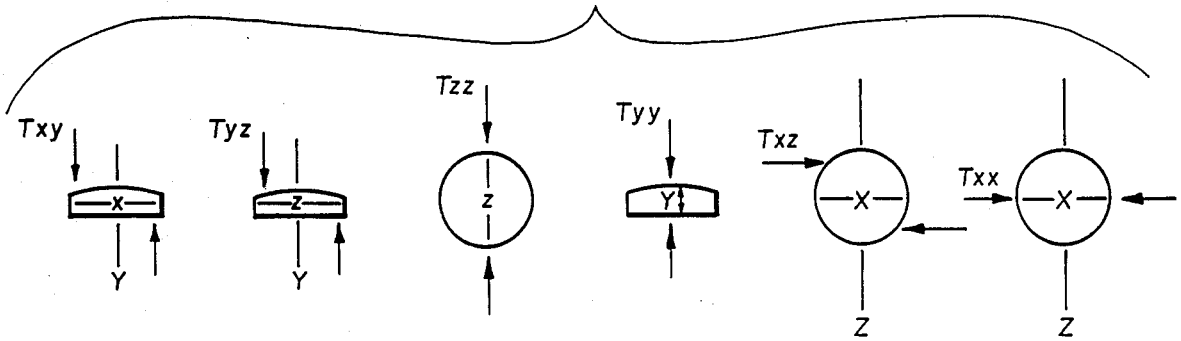

The above discussion considers only one stress component $T_{xx}$ which is the component of major concern for the specific acceleration forces considered in the FIGS. However, there are five other components of stress in a crystal for g acting from the left (acceleration to the right) which might contribute to the gamma vector. Each of the stress components (illustrated in FIG. 3), although depending primarily on the shape of the resonator, the placement of the support pins, and the mechanical properties of the support pins, can be determined and the effects thereof compensated for to modify and/or reduce the gamma vector.

Some of the components of stress are not zero at the center of the resonator (i.e., do not have odd symmetry), so shifting the vibration energy distribution has only a small effect on that stress component's contribution to the gamma vector. For example, FIGS. 4A and 4B illustrate a side view and top plan view of plano-convex crystal 76 accelerated again to the right or g acting from the left. This produces a shear stress $T_{xY}$, shown by graph in FIG. 4C, because the convex shape has a protruding portion 80 above the line of support provided by support pins 82 and 84. Thus, there is a net, or average value $T_{xY}$, shown in the graph of FIG. 4D, when averaged over the thickness (y axis) of the crystal 76. This "average $T_{xY}$" has even symmetry about the z axis as shown in FIG. 4D. The active region of vibration 88 (FIG. 4B) has even symmetry about the z axis as shown in FIG. 4E. Of course, there is still a net positive area of the product of "average $T_{xY}$" and energy density as seen in the graph of FIG. 4F. Thus, there will be a gamma vector component due to $T_{xY}$ no matter how symmetric the vibration energy density is. This type of effect limits the improvement that can be achieved by making the energy density perfectly symmetric about any one axis.

In some cases, the gamma vector magnitude can be reduced even further than the symmetrical active region case by a small controlled amount of shift of the active region position. In other words, for some cases, the lowest acceleration sensitivity, i.e., smallest gamma vector, is obtained with the active region of vibration slightly off-center. Obtaining the lowest acceleration sensitivity by moving the active region off-center would be achieved using methods already discussed for reducing the gamma vector.

Another cause of acceleration sensitivity is lack of symmetry of the mounting pins, such as in their positioning, or in their relative bending rigidities. In this case, the stress is non-symmetric, so even if the active region of vibration is symmetric, the product of stress and energy density has a non-zero net value. FIG. 5 shows one example-where the active region of vibration is symmetric about the x axis, but support pins 100 and 104 holding the crystal 108 are offset in the z axis direction. FIG. 5 shows in graph 112 the shear stress $T_{xz}$ due to the attraction of gravity from the left. Since the center of mass of the resonator is above the pin mounts, there is more overhang which causes more shear stress above the pins than below the pins. As seen in graph 116 of FIG. 5, the product of energy density 114 times shear stress (averaged over the crystal volume) shows a net area (area 120 under the curve greater than the other area 124). This can be corrected by appropriately adding (or substracting) mass to the crystal to shift the location of the active region of vibration or by repositioning the pins 100 and 104 so they are not offset in the direction of the z axis. Another approach is to remove some of the exterior of the crystal 108 to better distribute the crystal mass with respect to the pins and thereby rearrange and redistribute the stress pattern in the crystal. Removal of a portion of the crystal could be accomplished by grinding, air abrasive, or other known methods. Finally, mass can be added and then some selectively removed. Gold has been mentioned as a type of material which could be added, but other materials could also be used including insulator material such as silicon dioxide.

In the case of a more complicated but well known quartz structure where the resonator has an integral quartz support ring with bridge supports, the bridges can be thinned, by air abrasive for example, to adjust the support effect, and thus the acceleration sensitivity.

In the manner described, quartz crystal resonators may be fabricated to modify or reduce the sensitivity of the resonators to gravity and acceleration. In particular, the shape of the resonator may be modified by adding bulk such as by thin film deposition, by removing bulk such as by abrading or grinding the crystal, or by adding material and then removing selected portions, to thereby modify the gamma vector-the measure of acceleration sensitivity. Also, repositioning or changing mechanical properties of resonator mounting supports may also serve to modify the gamma vector.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. For example, although the invention has been discussed primarily in terms of reducing acceleration sensitivity, e.g., as represented by the gamma vector, there may be situations in which it would be desirable to increase the gamma vector. An example of this might be in the use of two crystals arranged with their gamma vectors antiparallel. If the vectors were not of the same magnitude, it is desirable to either reduce or increase the magnitude of one of the vectors (or a combination of reducing one and increasing the other) to make the magnitude of the two vectors more nearly the same. It should also be understood that non-piezoelectric crystals, or even non-crystalline materials, may be used as the resonator.

What is claimed is:

1. A method of manufacturing crystal resonators to control acceleration sensitivity of said resonators comprising producing a piezoelectric crystal,
providing support structure for the crystal, providing excitation means for causing said crystal to resonate with an active region of vibration, determining at least one component of the acceleration sensitivity for said crystal, and modifying resonator mass to thereby move the location of the active region of vibration of the crystal and thus modify at least said one component of the acceleration sensitivity.

2. A method as in claim 1 wherein said modifying step comprises applying a thin film of material to a selected surface area of the crystal to thereby move the location of the active region of vibration of the crystal and thus reduce the acceleration sensitivity.

3. A method as in claim 2 wherein said applying step comprises depositing material on a selected surface area of the crystal.

4. A method as in claim 2 wherein said thin film of material is gold.

5. A method as in claim 2 wherein said thin film of material is silicon dioxide.

6. A method as in claim 1 wherein said modifying step comprises removing some of the crystal from a selected area to thereby move the location of the active region of vibration of the crystal and thus reduce the acceleration sensitivity.

7. A method as in claim 6 wherein said removing step comprises grinding the surface of the crystal with an abrasive.

8. A method as in claim 1 wherein said modifying step comprises applying a thin film of material to a substantial portion of the surface area of the crystal, and removing selected portions of the thin film to thereby reduce the acceleration sensitivity.

9. A method as in claim 1 wherein said excitation means includes electrodes fixed to said crystal and wherein said modifying step comprises removing a selected portion of an electrode to thereby reduce the acceleration sensitivity.

10. A crystal resonator made in accordance with the method of claim 1.

11. A method of manufacturing crystal resonators to control acceleration sensitivity of said resonators comprising producing a piezoelectric crystal, providing a support structure for the crystal, providing excitation means for causing said crystal to resonate with an active region of vibration, determining at least one component of the acceleration sensitivity for said crystal, and modifying the resonator mass by applying a thin film of material to a selected surface area of the crystal to thereby change the shape of the active region of vibration of the crystal and thus modify at least said one component of the acceleration sensitivity.

12. A method as in claim 11 wherein said modifying step further comprises applying a thin film of material to a substantial portion of the surface area of the crystal, and removing selected portions of the thin film to thereby reduce the acceleration sensitivity.

13. A crystal resonator made in accordance with the method of claim 11.

14. A method of manufacturing crystal resonators to control acceleration sensitivity of said resonators comprising producing a piezoelectric crystal, providing a support structure which contacts the crystal at two or more locations on the crystal, providing excitation means for causing said crystal to resonate with an active region of vibration, determining at least one component of the acceleration sensitivity for said crystal, and modifying the existing support structure to thereby modify the acceleration sensitivity.

15. A method as in claim 14 wherein said modifying step comprises moving one or more locations at which the support structure contacts the crystal to reduce the acceleration sensitivity.

16. A method as in claim 14 wherein said modifying step comprises varying the rigidity of the support structure to reduce the acceleration sensitivity.

17. A crystal resonator made in accordance with the method of claim 14.

18. A crystal resonator constructed to control acceleration sensitivity of said resonator and comprising a piezoelectric electric crystal, mounting structure for supporting the crystal, means for causing said crystal to resonate with a certain active region of vibration, and material positioned on a selected area of the crystal to move the active region of vibration from the location it would have had without the material on the crystal to thereby reduce the acceleration sensitivity.

19. A crystal resonator as in claim 18 wherein said material comprises a thin film of material deposited on a selected area of the crystal.

20. A crystal resonator as in claim 19 wherein said material is gold.

21. A crystal resonator as in claim 24 wherein said material is silicon dioxide.

22. A crystal resonator constructed to control the acceleration sensitivity of said resonator and comprising a piezoelectric crystal, mounting structure for supporting the crystal, means for causing said crystal to resonate with a certain active region of vibration, and said piezoelectric crystal including a section where a portion of the crystal has been removed to move the active region of vibration from the location it would have had without a portion of the crystal removed to thereby reduce the acceleration sensitivity.

* * * * *